United States Patent
Gasanov et al.

(10) Patent No.: US 6,701,493 B2
(45) Date of Patent: Mar. 2, 2004

(54) FLOOR PLAN TESTER FOR INTEGRATED CIRCUIT DESIGN

(75) Inventors: Elyar E. Gasanov, Moscow (RU); Andrej A. Zolotykh, Moskovskaya Oblast (RU); Ivan Pavisic, San Jose, CA (US); Aiguo Lu, Cupertino, CA (US)

(73) Assignee: LSI Logic Corporation, Milpitas, CA (US)

(*) Notice: Subject to any disclaimer, the term of this patent is extended or adjusted under 35 U.S.C. 154(b) by 132 days.

(21) Appl. No.: 10/109,113

(22) Filed: Mar. 27, 2002

(65) Prior Publication Data

US 2003/0188274 A1 Oct. 2, 2003

(51) Int. Cl.[7] .............................................. G06F 17/50
(52) U.S. Cl. ................................ 716/4; 716/13; 716/14
(58) Field of Search ................................ 716/4, 13, 14

(56) References Cited

U.S. PATENT DOCUMENTS

| | | | | |
|---|---|---|---|---|
| 4,500,963 A | * | 2/1985 | Smith et al. ..................... | 716/9 |
| 5,648,912 A | * | 7/1997 | Narayanan et al. ............. | 716/18 |
| 6,324,675 B1 | * | 11/2001 | Dutta et al. ..................... | 716/13 |
| 6,349,403 B1 | * | 2/2002 | Dutta et al. ..................... | 716/12 |
| 6,415,426 B1 | * | 7/2002 | Chang et al. .................... | 716/9 |
| 2003/0163797 A1 | * | 8/2003 | Stenberg et al. ............... | 716/13 |

FOREIGN PATENT DOCUMENTS

JP          04105173 A    *  4/1992    ........... G06F/15/60

OTHER PUBLICATIONS

NB83123895, "Wiring Multinode Nets", IBM Technical Disclosure Bulletin, vol. 26, No. 7B, Dec. 1983, pp. 3895–3900 (8 pages).*

NN650617, "Automatic Placement Technique Using Blockage Measurement", IBM Technical Disclosure Bulletin, vol. 8, No. 1, Jun. 1965, pp. 17–18 (4 pages).*

NN73053703, "Program for Vender Transistor Logic (VTL) Card Design", IBM Technical Disclosure Bulletin, vol. 15, No. 12, May 1973, pp. 3703–3706 (8 pages).*

NA83045571, "Procedure for Connecting N Points with Near Minimum Cost", IBM Technical Disclosure Bulletin, vol. 25, No. 11A, Apr. 1983, pp. 5571–5575 (8 pages).*

NN950127, "Algorithm for Incremental Timing Analysis", IBM Technical Disclosure Bulletin, vol. 38, No. 1, Jan. 1995, pp. 2 34 ( 18 pages).*

* cited by examiner

Primary Examiner—Matthew Smith
Assistant Examiner—Phallaka Kik
(74) Attorney, Agent, or Firm—Fitch, Even, Tabin & Flannery

(57) ABSTRACT

A method of testing a floor plan for an integrated circuit prior to resynthesis includes attempting to construct a least-penalty path connecting pins of each long distance pin pair in the floor plan to determine whether the floor plan has an unreachable pin; and if the least-penalty path is constructed, then attempting to construct a least-penalty path connecting pins of each long distance pin pair in the floor plan to determine whether the floor plan has a bottleneck.

14 Claims, 8 Drawing Sheets

FLOOR PLAN TESTER FOR INTEGRATED CIRCUIT DESIGN

FIELD OF THE INVENTION

The present invention relates generally to the design of integrated circuits. More specifically, but without limitation thereto, the present invention relates to methods for testing an integrated circuit design for ramptime violations.

BACKGROUND OF THE INVENTION

The physical design of an integrated circuit chip includes a plurality of cells, or macros, each of which contains one or more circuit elements arranged to perform a specific function. Each of these cells has one or more pins that are connected by wires to one or more pins of other cells in the chip. The set of pins connected by the wire defines a net, and a netlist is a list of all the nets in the chip. Each cell may represent a single circuit element, such as a gate, or a cell may represent several circuit elements interconnected in a standardized manner to perform a specific function. Cells that consist of two or more interconnected gates or other circuit elements may also be made available to a circuit designer in a library of standard cell designs. In a chip design, or chip layout, cells generally have a rectangular outline. Ordinal cells usually have the same height, although they may differ in width.

Ordinal cells are typically arranged in rectangular regions along rows in a chip. The height of each row is equal to the common height of the ordinal cells, and the length of a row is generally equal to the width of the chip.

A physical design of an integrated circuit, or "floor plan", receives as input a circuit diagram and generates as output a chip layout that implements the circuit diagram.

SUMMARY OF THE INVENTION

In one aspect of the present invention, a method of testing a floor plan prior to resynthesis includes attempting to construct a least-penalty path connecting pins of each long distance pin pair in the floor plan to determine whether the floor plan has an unreachable pin; and if the least-penalty path is constructed, then attempting to construct a least-penalty path connecting pins of each long distance pin pair in the floor plan to determine whether the floor plan has a bottleneck.

In another aspect of the present invention, a computer program product includes a medium for embodying a computer program for input to a computer; and a computer program embodied in the medium according to well known programming techniques for causing the computer to perform the following functions: attempting to construct a least-penalty path connecting pins of each long distance pin pair in the floor plan to determine whether the floor plan has an unreachable pin; and if the least-penalty path is constructed, then attempting to construct a least-penalty path connecting pins of each long distance pin pair in the floor plan to determine whether the floor plan has a bottleneck.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which.

Figure 1:
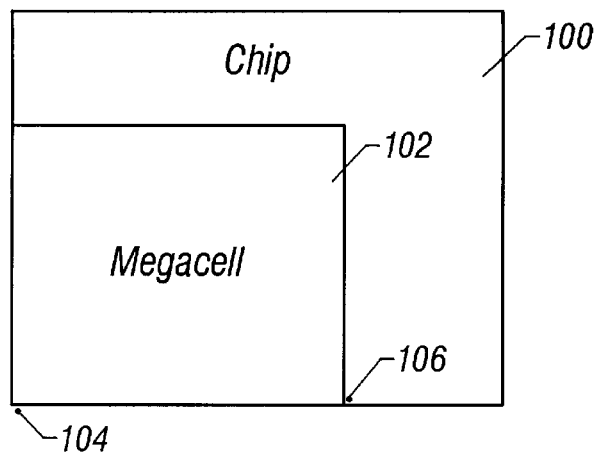
FIG. 1 illustrates an example of a floor plan for an integrated circuit design that has an unreachable pin.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

The physical design of an integrated circuit chip is performed in several stages, including (1) partitioning, (2) floor planning, (3) placement, (4) resynthesis, and (5) routing.

(1) Partitioning: A chip may contain several million transistors. Ordinarily, computer-aided design techniques are not capable of laying out an entire chip circuit design due to limitations on available memory space and computation power. The circuit design is therefore partitioned into blocks, such as subcircuits and modules. The actual partitioning process takes into account several factors, such as the number and size of the blocks and the number of interconnections between the blocks. Some modules are typically "frozen" by a user requirement, that is, the module design must be preserved for later use in constructing other chips. The output of the partitioning is a set of blocks and the interconnections required among the blocks. In large circuits, the partitioning process is often hierarchical, and at the top level, a circuit may have from five to twenty-five blocks. Each of the top level blocks is partitioned recursively into smaller blocks in lower levels of the hierarchy. Consequently, each block is assigned an area of the chip where the cells of the block are to be placed.

(2) Floor planning: Floor planning takes into account various alternatives for laying out each block and selects the most efficient alternative, including the layout of megacells. A megacell is a large or very large standard module layout stored in a circuit library. Floor planning is a critical step in establishing a foundation for a successful layout. In many cases, the floor planning is performed manually.

(3) Placement: During placement, the ordinal cells are assigned exact locations in each block. The goal of placement is to find the optimum locations of the ordinal cells to minimize the wire length and to satisfy timing constraints. If the placement is poor, the total wire length is large, which may result in a variety of circuit performance problems, including violations of timing constraints.

(4) Resynthesis: During resynthesis, the chip netlist is rearranged to minimize path delays between cells, to eliminate ramptime violations, and to minimize the total area required by the cell. If the floor plan is poor, that is, if it contains ramptime violations that cannot be corrected, then the resynthesis procedure runs for an excessive time attempting to eliminate the ramptime violations. The longer run time results in correspondingly higher redesign costs.

(5) Routing: In the final step of the physical design, the interconnections between the cells are laid out according to the cell netlist.

The floor plan tester of the present invention is applied after the floor planning before the resynthesis stage to determine whether it is possible for the resynthesis procedure to eliminate all the ramptime violations.

FIG. 1 illustrates an example of a floor plan 100 for an integrated circuit design that has an unreachable pin. Shown in FIG. 1 are a megacell 102 and pins 104 and 106.

If the distance between pins 104 and 106 is sufficiently large, then the corresponding net has a ramptime violation. The ramptime violation may not be eliminated because there is no available space for inserting a buffer between pins 104 and 106 of the net. Because there is no available space on the chip to insert a buffer to connect to pin 104, the floor plan 100 has an "unreachable pin".

Figure 2:
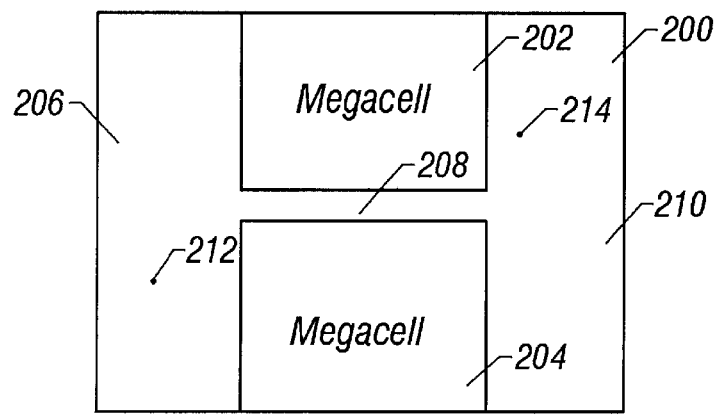
FIG. 2 illustrates an example of a floor plan 200 that has a bottleneck.

FIG. 2 illustrates an example of a floor plan 200 that has a bottleneck. Shown in FIG. 2 are megacells 202 and 204, a left region 206, a middle region 208, and a right region 210, and pins 212 and 214.

The floor plan 200 includes three regions: the left region 206, the middle region 208, and the right region 210. The floorplan 200 also includes the megacells 202 and 204. The pin 212 is located in the left region 206 and the pin 214 is located in the right region 210. If the distance between the pins 212 and 214 is too large, then a chain of buffers should be inserted in the net connecting pins 212 and 214 to eliminate the ramptime violation. The chain of buffers (not shown) cross the middle region 208. If there are many nets containing pins placed both in the left region 206 and the right region 210, then many chains of buffers will cross the middle region 208. Once the middle region 208 is filled, no more buffer chains can cross the middle region 208. When a path connecting pins in the left region 206 and the right region 210 cannot be constructed because the middle region 208 is full, the floor plan 200 has a "bottleneck".

Floor plan defects such as those described above may be detected quickly by the floor plan test procedure of the present invention before committing the floor plan to the resynthesis stage of the physical design.

Each pair of pins in a net may be represented by a vertex of a lattice graph defined by the floor plan.

Figure 3:
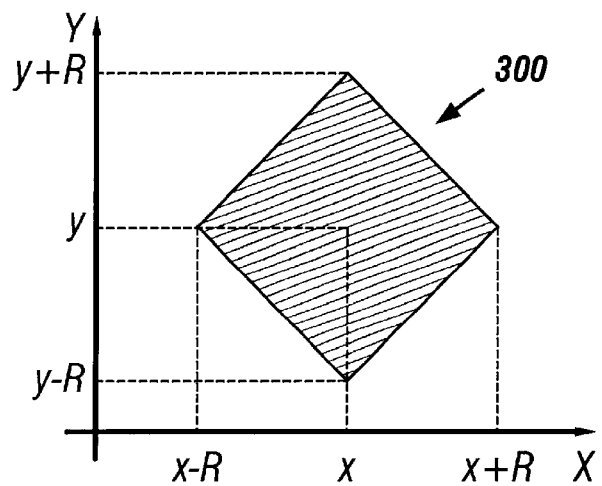
FIG. 3 illustrates an example of a lattice graph 300 according to an embodiment of the present invention.

FIG. 3 illustrates an example of a lattice graph 300 according to an embodiment of the present invention. If the coordinates $(x_1,y_1)$ and $(x_2,y_2)$ represent two pins of a net, then the distance between the two pins is given by the formula:

$$d((x_1, y_1), (x_2, y_2))=|x_1-x_2|+|y_1-y_2| \quad (1)$$

Formula (1) is also referred to as the manhattan metrics. The set of points $S_R$ given by the formula $$S_R(x_0,y_0)=\{(x,y)|d((x_0,y_0),(x,y))\leq R\} \quad (2)$$

is called the sphere having a center at $(x_0,y_0)$ and a radius equal to R. The set of points $S_R$ is enclosed by the square-shaped area in FIG. 3. If the distance between pins is expressed in Euclidean metrics as in formula (1), then the set of points $S_R$ is circular. If the distance between points is expressed in Manhattan metrics as $$\sqrt{(x_1-x_2)^2+(y_1-y_2)^2},$$

then the set of points $S_R$ is square as shown in FIG. 3.

If p is an output pin, then Maxcapacity(p) denotes the maximal capacity of the net driven by the pin p below which no ramptime violation occurs. If p is an input pin, then PinCapacity(p) denotes the capacity of the pin p. If C is a buffer type, $p_{in}$ is the input pin of a buffer of type C, and $p_{out}$ is the output pin of a buffer of type C, then the maximum distance between buffers of type C is given by the formula:

$$\text{Distance}(C) = \frac{(MaxCapacity(p_{out}) - PinCapacity(p_{in}))}{(WireCapacityCoeff)} \quad (3)$$

where WireCapacityCoeff is a coefficient that may be multiplied by a wire length Len to find the capacity of the wire. If a buffer chain contains two buffers of the same type C, then the distance between these buffers should be less than or equal to Distance(C). If not, then a ramptime violation may appear.

The optimal buffer type $C_{opt}$ to construct buffer chains may be found from the formula:

$$\text{Distance}(C_{opt})=\max\{\text{Distance}(C), \text{where } C \text{ is a buffer type}\} \quad (4)$$

The maximum distance allowed between buffers of type C in a buffer chain is defined by the relation $$\text{MaxDistance}=\text{DecreaseCoeff}\cdot\text{Distance}(C_{opt}) \quad (5)$$

where DecreaseCoeff is a parameter typically having a value of 0.9. The distance between buffers in buffer chains constructed using buffers of type $C_{opt}$ should not exceed MaxDistance.

Figure 4:
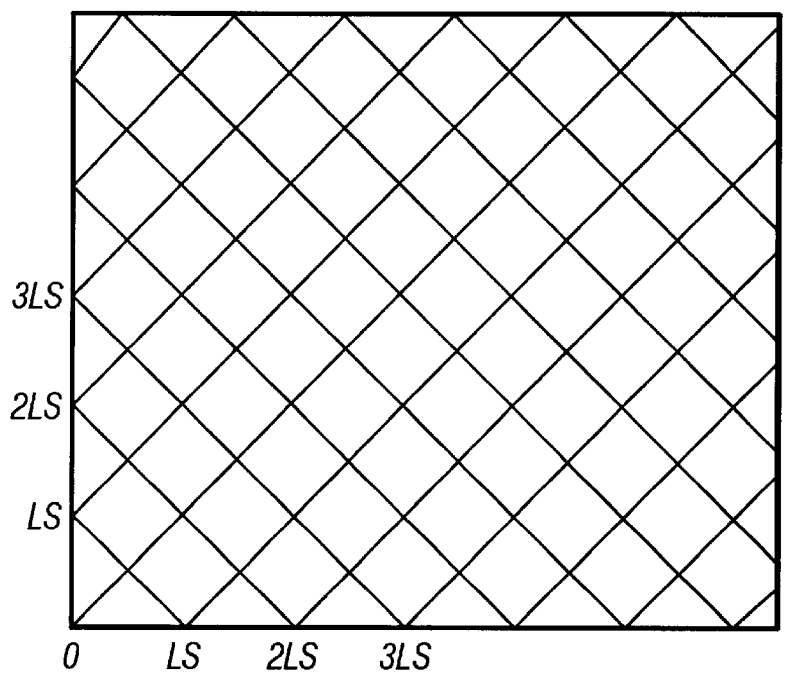
FIG. 4 illustrates the area of a chip partitioned into adjoining square areas in accordance with an embodiment of the present invention.

FIG. 4 illustrates the area of a chip 400 partitioned into adjoining square areas in accordance with an embodiment of the present invention. The adjoining square areas are defined as the vertices of a lattice graph. The length of the diagonal of each square is the lattice step LS given by $$LS = \frac{MaxDistance}{K} \quad (6)$$

where K is an integer coefficient having a typical value of 2 or 3.

Figure 5:
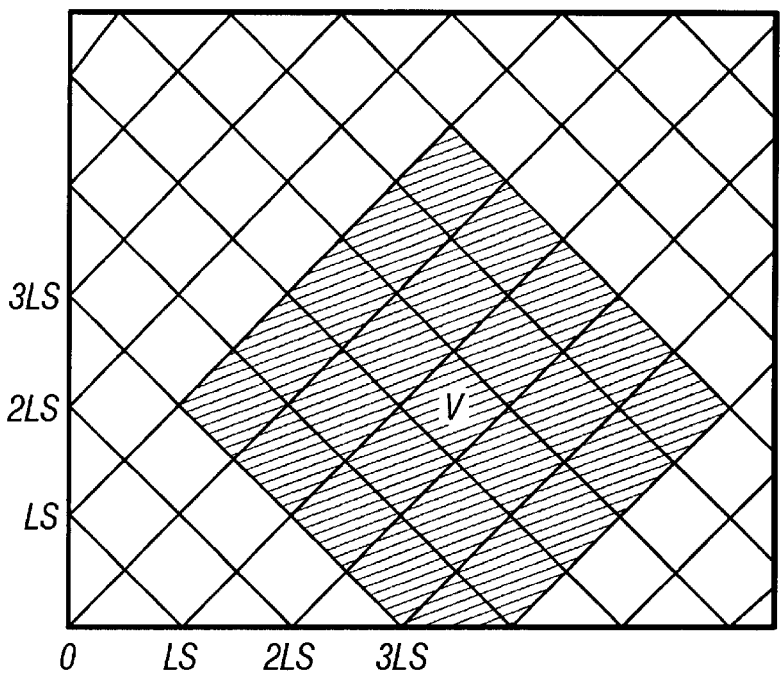
FIG. 5 illustrates a set of adjoining vertices from the partition of FIG. 4.

FIG. 5 illustrates a set of adjoining vertices from the partition of FIG. 4. Each of the vertices enclosed in the hatched area is called a "ball". The 0-ball of the vertex v in the center of the set is defined as a one element set by the formula:

$$B_0(v)=\{v\} \quad (7)$$

Figure 6A:
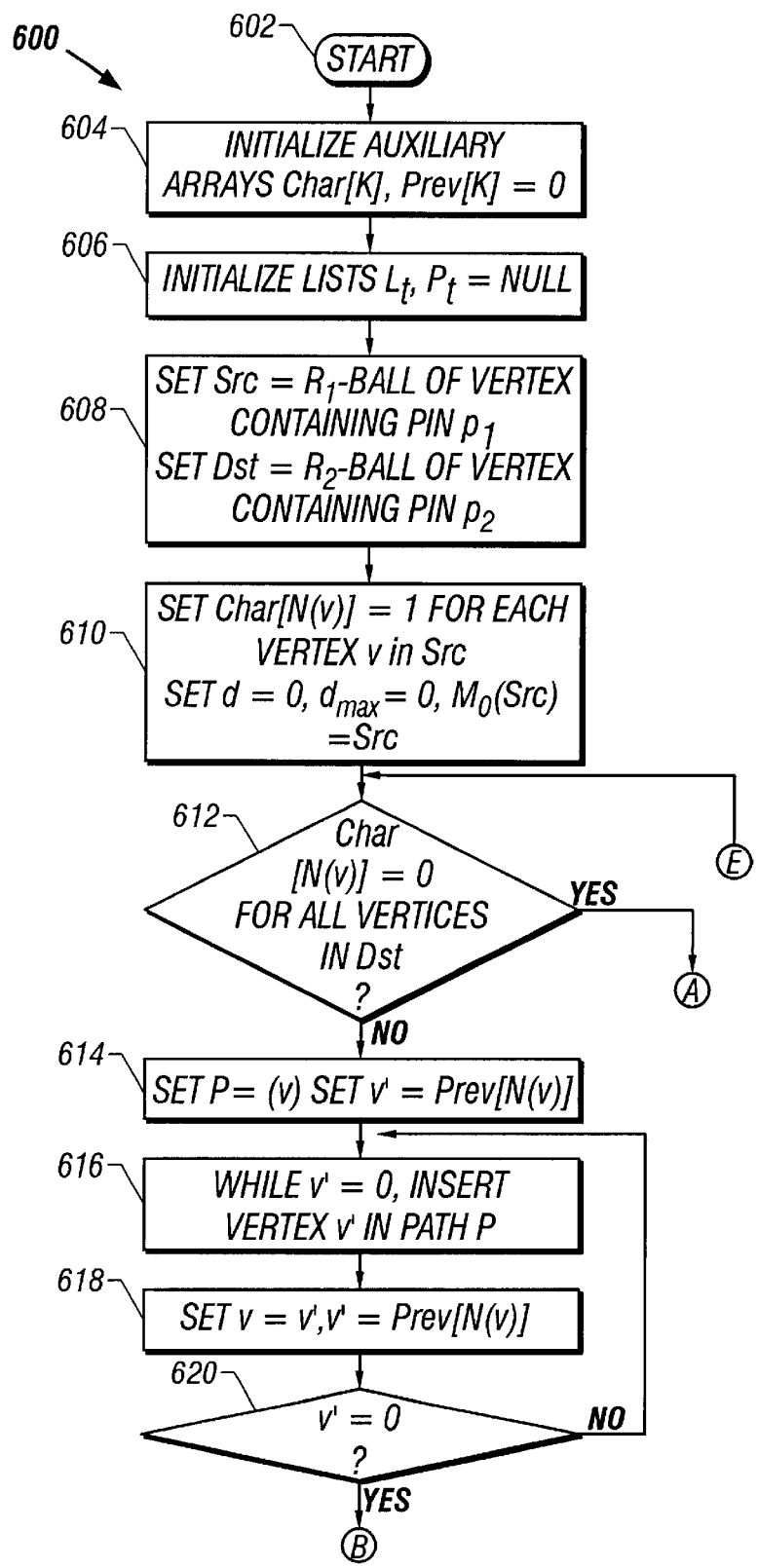
FIG. 6 illustrates a flow chart 600 of a method of constructing a least-penalty path P connecting pins $p_1$ and $p_2$ in accordance with the present invention.
Figure 6B:
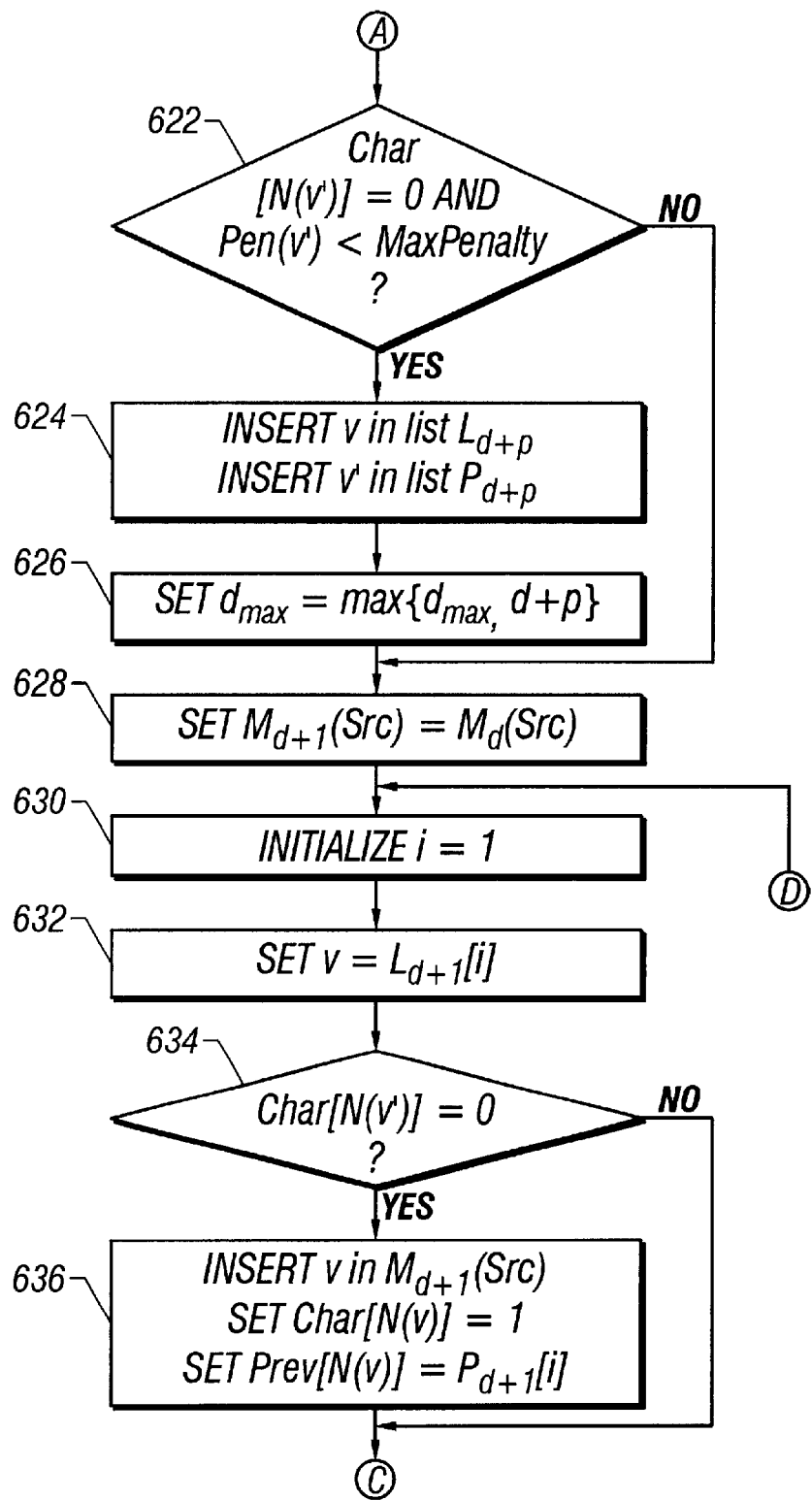
Figure 6C:
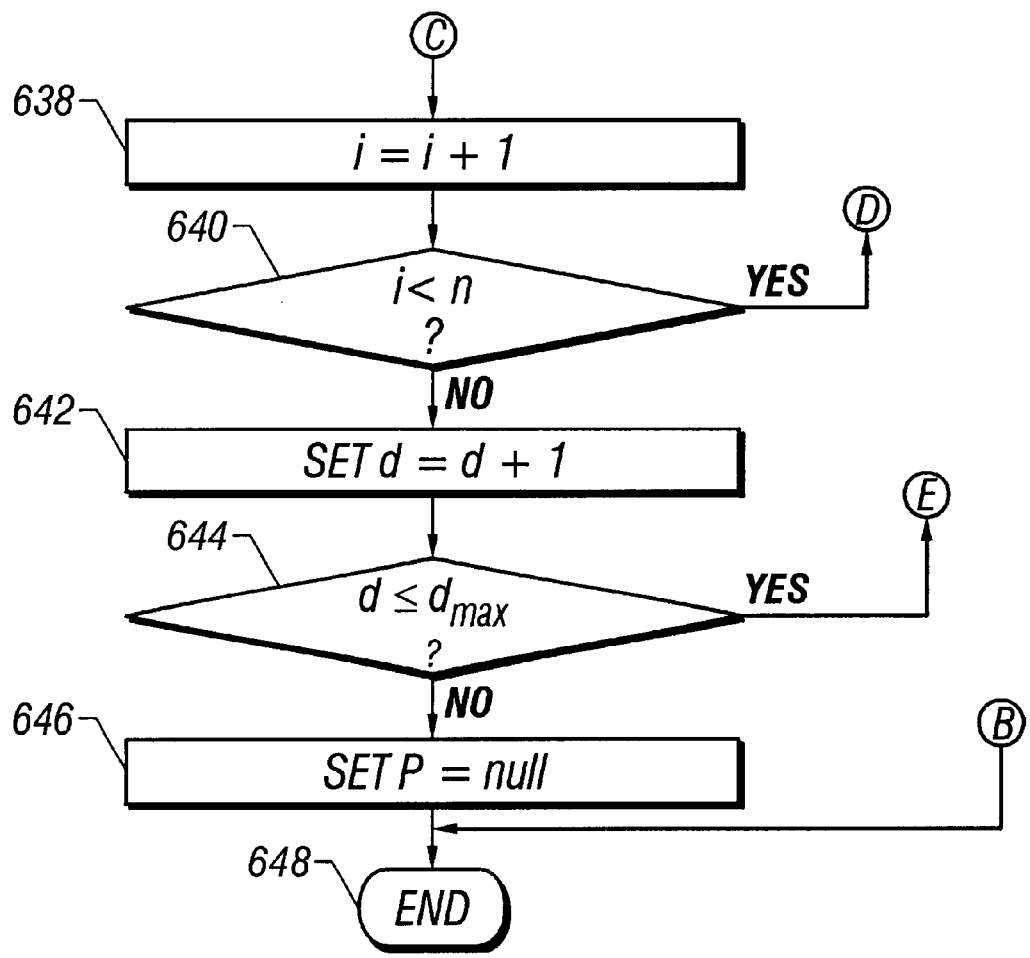

The m-ball of the vertex v defined by the formula $$B_m(v)=B_{m-1}(v)\cup B'_m(v) \quad (8)$$

where m>0 and $B'_m(v)$ is the set of all vertices adjacent to the vertices in the set $B_{m-1}$. In the example of FIG. 6, the vertices enclosed in the hatched area represent a 2-ball. The area of $B_m(v)$ has a value that lies within a range given by the formula:

$$|B_m(v)|\leq(2\cdot m+1)^2 \quad (9)$$

If the vertex v is far enough from the boundary of the chip, then the area of $B_m(v)$ is given by the formula:

$$|B_m(v)|=(2 \cdot m+1)^2 \qquad (10)$$

Each vertex v of the lattice graph is connected to each vertex of $B_K(v)\setminus\{v\}$ by an edge in the lattice graph, where if A and B are sets, then $a \in A\setminus B$ means $a \in A$ & $a \in B$. For any point (x,y) of the area of a vertex v, the sphere $S_{MaxDistance}(x,y)$ is a subset of the K-ball $B_K(v)$.

As explained previously, ordinal cells are placed in rows on the chip. Ordinal cells usually have the same height, although their widths may vary. Typically, there is a free space between adjacent cells in a row, and the cells cover only 35% to 60% of the area of the chip. If A is defined as some part of the chip, the FreeSpace(A) denotes the total free space in the rows included in A.

For each vertex v of the lattice graph, the capacity is defined by the formula:

$$\text{Capacity}(v) = \frac{\text{FreeSpace}(v)}{W_{opt}} \qquad (11)$$

where $W_{opt}$ is the width of a buffer cell of type $C_{opt}$. Capacity(v) is defined as the number of buffer cells of type $C_{opt}$ that may be placed into the area enclosed by the vertex v.

A penalty function pen(i) is a decreasing, natural-valued function that may be determined in a number of ways. For example, the penalty function may be set according to the formula:

$$pen(i) = \begin{cases} MaxPenalty - i & 0 \le i < MaxPenalty \\ 1 & i \ge MaxPenalty \end{cases} \qquad (12)$$

where MaxPenalty is a parameter having a typical value of 30.

For each vertex v of the lattice graph, the penalty function Pen(v) is defined by the formula:

$$\text{Pen}(v)=\text{pen}(\text{Capacity}(v)) \qquad (13)$$

Pen(v) is the penalty of the vertex v. If Pen(v) equals MaxPenalty, then there is no space for a buffer of type $C_{opt}$ in the area defined by vertex v. By calculating Pen(v) for each vertex v in the chip, the floor plan may be tested quickly to determine whether the resynthesis stage can correct ramptime violations.

A path between vertices of the lattice graph representative of a selected pin pair $(p_1, p_2)$ may be constructed as follows. The maximum allowable distance from the input pin is given by $$D_1 = \frac{(MaxCapacity(p_1) - PinCapacity(pi_{opt}))}{(WireCapacityCoeff)} \qquad (14)$$

and the maximum allowable distance from the output pin is given by $$D_2 = \frac{(MaxCapacity(po_{opt}) - PinCapacity(p2))}{(WireCapacityCoeff)} \qquad (15)$$

where $pi_{opt}$ is the input pin of a buffer of type $C_{opt}$, and $po_{opt}$ is the output pin of a buffer of type $C_{opt}$, which may be normalized to the lattice graph by $$R_1 = \frac{D_1}{LS} \qquad (16)$$

and $$R_2 = \frac{D_2}{LS} \qquad (17)$$

To avoid ramptime violations in the chain connecting the pins $p_1$ and $p_2$, the first buffer should be placed inside a sphere having a radius $D_1$ centered on the location of the pin $p_1$, and the last buffer should be placed inside a sphere having a radius $D_2$ centered on the location of $p_2$.

A sequence of vertices $P=(v_1, \ldots, v_n)$ is called a path if n=1 or if for each i=2,3, . . . ,n the pair of vertices $(v_{i-1}, v_i)$ is an edge of the lattice graph. A path $P=(v_1, \ldots, v_n)$ connects pins $p_1 \in v'$ and $p_2 \in v''$ if $v_1 \in B_{R_1}(v')$ and $v_2 \in B_{R_2}(v'')$.

The penalty of the path $P=(v_1, \ldots, v_n)$ is given by the formula $$\text{Pen}(P) = \sum_{i=1}^{n} \text{Pen}(v_i) \qquad (18)$$

A chain of buffers of type $C_{opt}$ connecting the selected pin pair may be assigned to each path $P=(v_1, \ldots, v_n)$ connecting the pins $p_1$ and $p_2$ such that the i-th buffer of the chain is placed into the area of the i-th vertex. The path resulting in the lowest penalty may be constructed as follows.

If V is the set of vertices of the lattice graph, then the vertex number is the number of vertices in the lattice graph given by the relation:

$$\text{VertexNumber}=|V| \qquad (19)$$

The vertices of the lattice graph may be enumerated by the numbers from 1 to VertexNumber, where N(v) is the vertex number of the vertex v. Vertices v and v' are called neighbors if (v,v') is an edge of the lattice graph. A sequence of vertices $P=(v_1, \ldots, v_n)$ is called a path connecting vertices $v_1$ and $v_n$ if n equals 1 or if $(v_{i-1}, v_i)$ is an edge of the lattice graph for each i=2,3, . . . ,n. The penalty of the path $P=(v_1, \ldots, v_n)$ is calculated by formula (18). The distance between the vertices v and v' is the minimum of the penalties of the paths connecting v and v' and may be represented as Dist (v, v'). If there is no path connecting the vertices v and v', then Dist(v,v')=∞. If $A,B \subset V$ and $v \in V$, then the path distance may be defined by the formulas:

$$\text{Dist}(A,v)=\min\{\text{Dist}(v',v), v' \in A\} \qquad (20)$$

and $$\text{Dist}(A,B)=\min\{\text{Dist}(A,v), v \in B\} \qquad (21)$$

If $A \subseteq V$, then the t-neighborhood of the set A is the set $M_t(A)=\{v \in V, \text{Dist}(A,v) \le t\}$ where t is a natural number.

Given the vertex v' containing the pin $p_1$ and the vertex v'' containing the pin $p_2$, the source variable Src is set equal to $B_{R1}(v')$ and the destination variable Dst is set equal to $B_{R2}(v')$. The path between $p_1$ and $p_2$ is constructed by extending the neighborhood of the set Src until it intersects the set Dst, then repeatedly choosing the least-penalty path from the last pin to the previous pin from $p_2$ back to $p_1$.

The radius of the current neighborhood is given by the formula:

$$d=\text{Dist}(Src, Dst) \qquad (22)$$

Two auxiliary arrays are defined as Char[VertexNumber] and Prev[VertexNumber], where VertexNumber is defined by the relation (19) and Char[N(v)]=1 if a vertex v belongs to the current neighborhood, else Char[N(v)]=0. The function Prev[N(v)] is defined equal to 0 if $v \notin M_d(Src)\backslash Src$, else Prev[N(v)]=v', where (v',v) is the last edge of a least-penalty path connecting the set Src and the vertex v. The procedure also uses two sequences of lists $L_1, L_2, L_3, \ldots, L_t$ and $P_1, P_2, P_3, \ldots P_t$, where $L_t$ and $P_t$ are each a list of vertices, and t is a natural number. Each $L_t[i]$ is a candidate vertex to the t-neighborhood of the set Src, that is, $Dist(L_t[i], Src) \leq t$. $P_t$ is another list of vertices such that $(P_t[i], L_t[i])$ is the last edge in a path Q connecting the set Src and the vertex $L_t[i]$, and the penalty of the path Q is given by the formula:

$$Pen(Q)=t \qquad (23)$$

FIG. 6 illustrates a flow chart 600 of a method of constructing a least-penalty path P connecting a selected pin pair $(p_1, p_2)$ in accordance with the present invention.

Step 602 is the entry point of the flow chart 600.

In step 604, two auxiliary arrays Char[k] and Prev[k] are initialized to 0, where k is the number of vertices in the lattice graph.

In step 606, the lists $L_t$ and $P_t$ are initially set to null, that is, empty. $L_t$ and $P_t$ are each a list of vertices of the lattice graph such that $Dist(L_t[i], Src) \leq t$ and $(P_t[i], L_t[i])$ is the last edge in the path Q connecting the set Src and the vertex $L_t[i]$.

In step 608, the set Src (source) is set equal to the $R_1$-ball of the vertex v' in the lattice graph containing the pin $p_1$, and the set Dst (destination) is set equal to the $R_2$-ball of the vertex v" in the lattice graph containing the pin $p_2$, as described above with regard to formulas (16) and (17).

In step 610, Char[N(v)] is set equal to 1 for each vertex v in Src, the radius of the current neighborhood d is set equal to 0, the maximum radius $d_{max}$ is set to 0, and $M_0(Src)$ is set equal to Src.

In step 612, if Char[N(v)] equals 0 for all vertices v in Dst, then control transfers to step 622. Otherwise, control transfers to step 614.

In step 614, since Char[N(v)] does not equal 0, then it follows that $v \in M_d(Src)$. In that case, P is set equal to (v) and v' is set equal to Prev[N(v)].

In step 616, while v'≠0, the vertex v' is inserted at the beginning of the path P.

In step 618, v is set equal to v' and v' is set equal to Prev[N(V)].

In step 620, if v'=0, the path P is output as the result and control transfers to step 648. Otherwise, control transfers to step 616.

In step 622, for each neighboring vertex v' of each vertex v in the set $M_d(Src)\backslash M_{d-1}(Src)$, if Char[N(v')] equals 0 and if Pen(v') is less than MaxPenalty, then control transfers to step 624. Otherwise, control transfers to step 628.

In step 624, v is inserted in the list $L_{d+p}$ and v' is inserted in the list $P_{d+p}$.

In step 626, $d_{max}$ is set equal to max$\{d_{max}, d+p\}$.

In step 628, $M_{d+1}(Src)$ is set equal to $M_d(Src)$.

In step 630, i is initialized to 1.

In step 632, v is set equal to $L_{d+1}[i]$.

In step 634, if Char[N(v)] equals 0, then control transfers to step 636. Otherwise, control transfers to step 638.

In step 636, v is inserted in $M_{d+1}(Src)$, Char[N(v)] is set equal to 1, and Prev[N(v)] is set equal to $P_{d+1}[i]$.

In step 638, i is incremented by 1.

In step 640, if i is less than n, where n is the vertex number of the list $L_{d+1}$, then control transfers to step 632. Otherwise, control transfers to step 642.

In step 642, d is incremented by one.

In step 644, if $d \leq d_{max}$, then control transfers to step 612. Otherwise, if $d > d_{max}$, then there is no path connecting the sets Src and Dst, and control transfers to step 646.

In step 646, the path P is set to null and is output as the result.

Step 648 is the exit point of the flow chart 600.

In one aspect of the present invention, a method of testing a floor plan prior to resynthesis includes attempting to construct a least-penalty path connecting pins of a long distance pin pair in the floor plan to determine whether there is an unreachable pin in the floor plan; and if there is no unreachable pin, then attempting to construct a least-penalty path connecting pins of the long distance pin pair to determine whether there is a bottleneck in the floor plan.

Figure 7A:
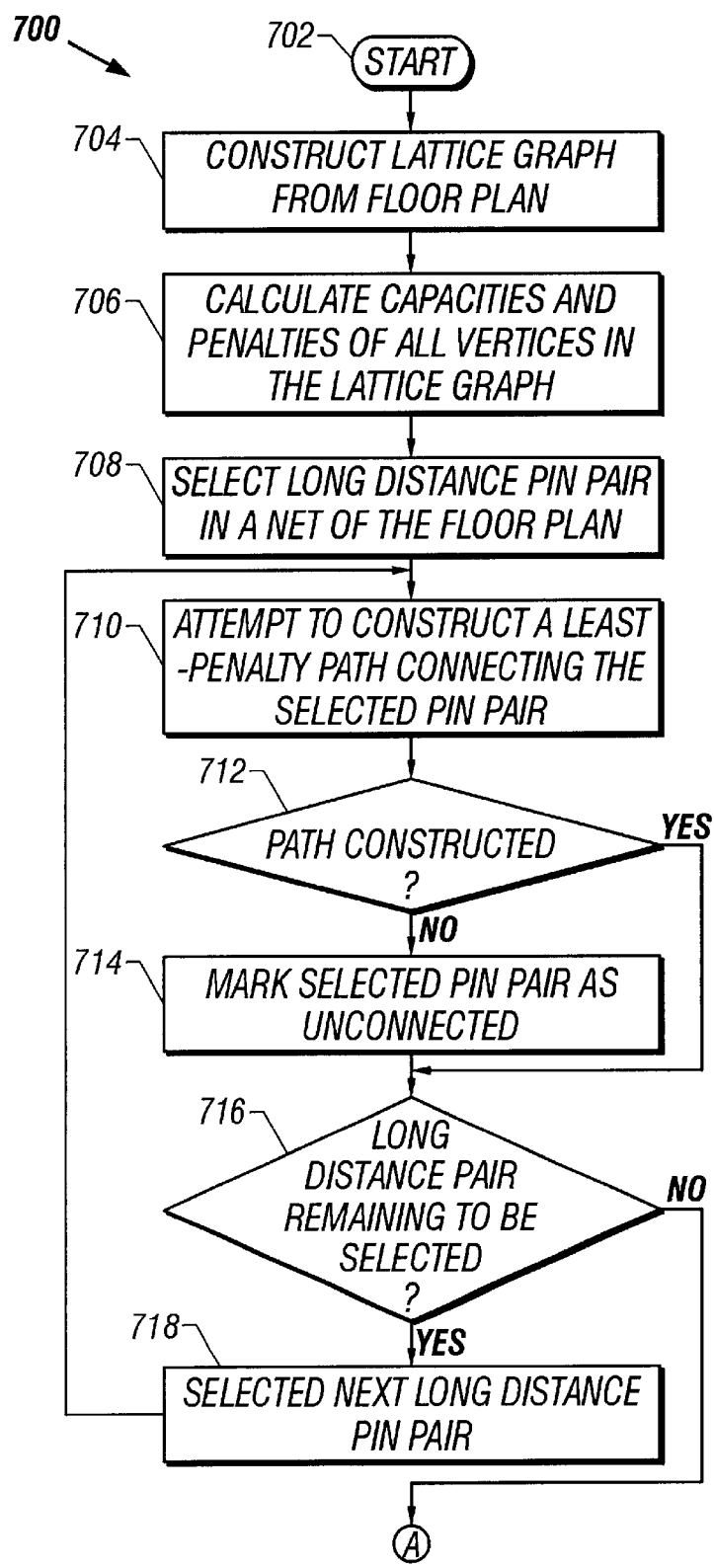
FIG. 7 is a flow chart of a method of testing a floor plan in accordance with an embodiment of the present invention.
Figure 7B:
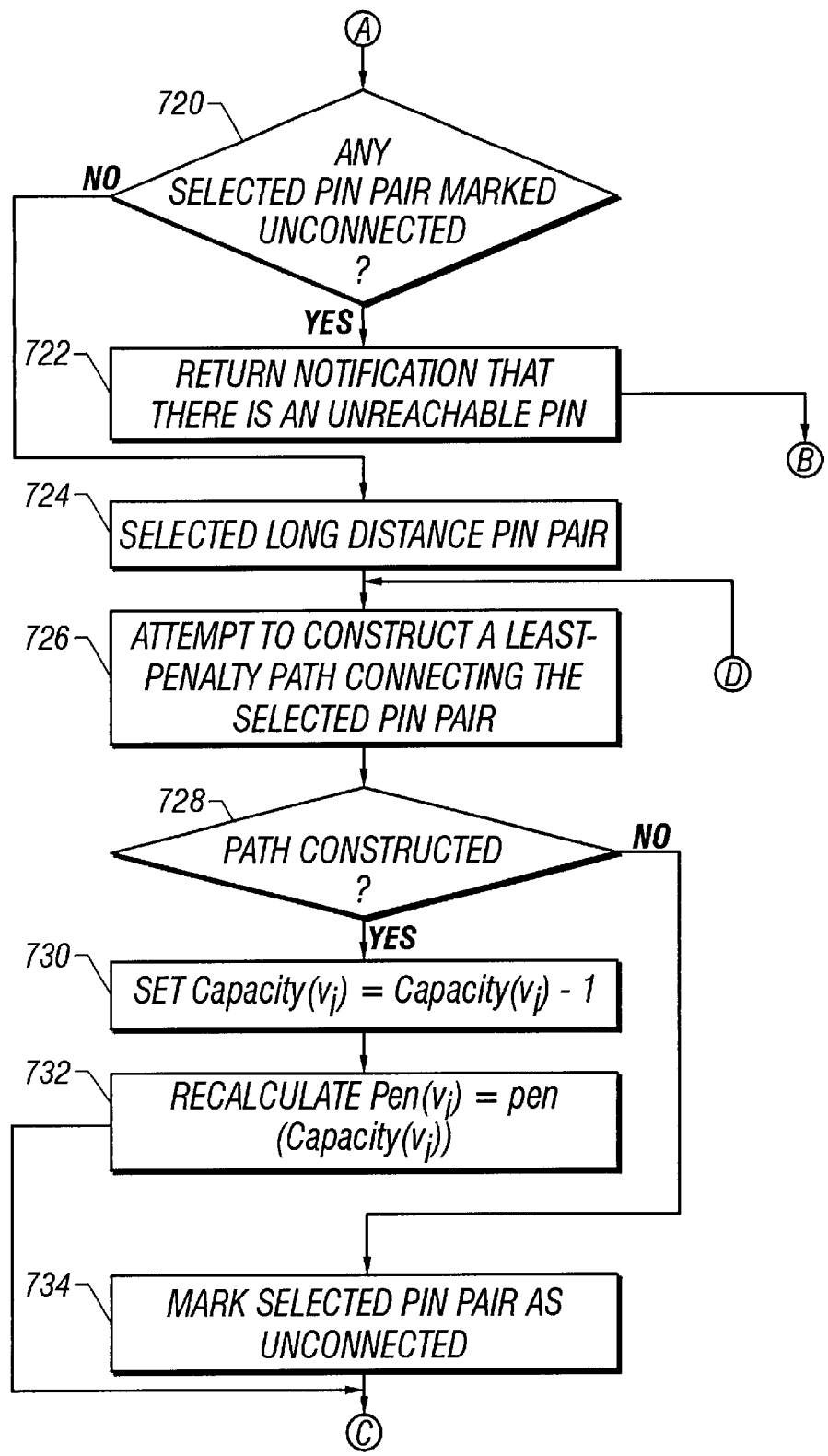
Figure 7C:
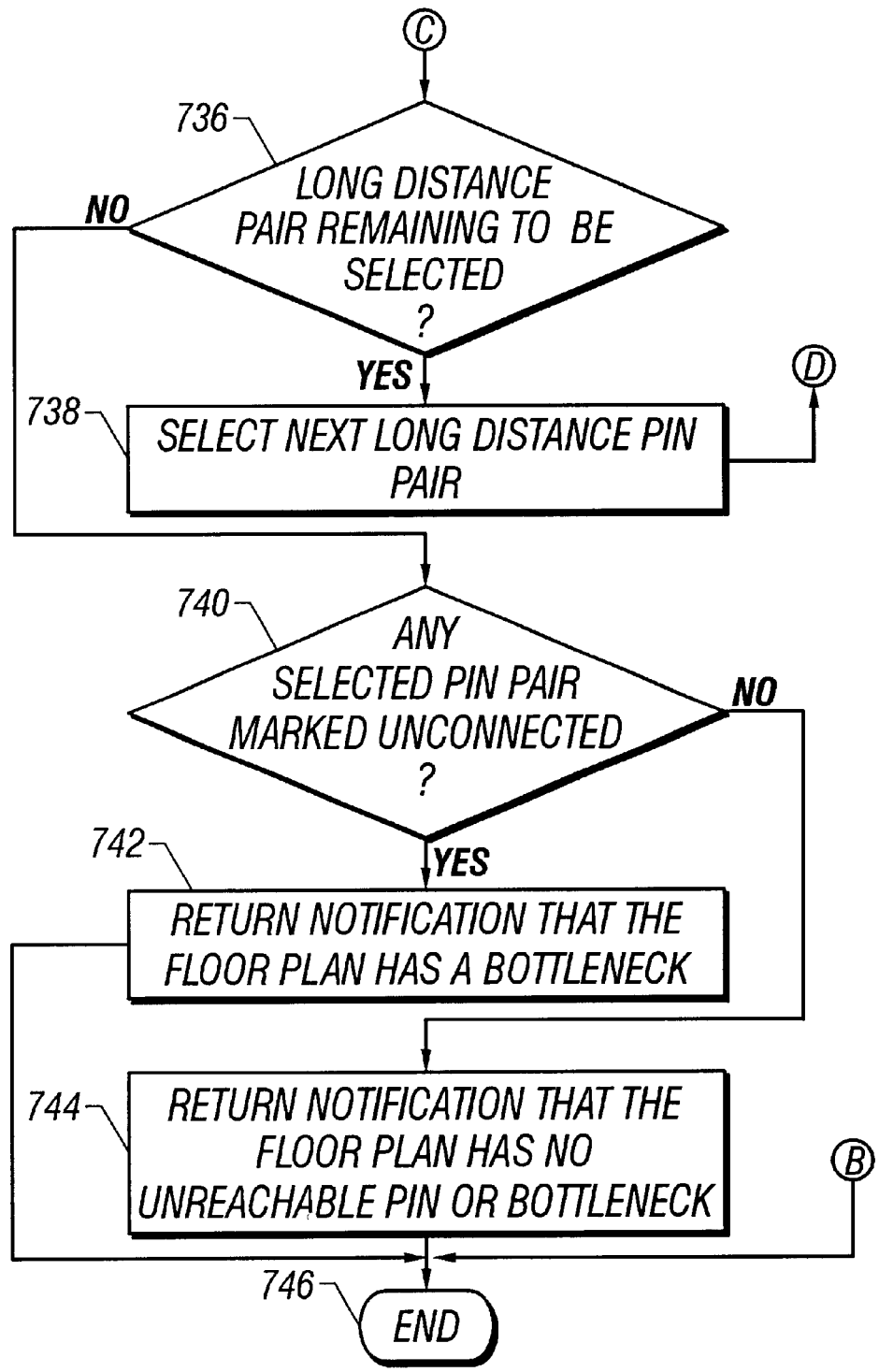

FIG. 7 is a flow chart of a method of testing a floor plan in accordance with an embodiment of the present invention.

Step 702 is the entry point of the flow chart 700.

In step 704, a lattice graph is constructed from the floor plan as explained above with reference to FIGS. 4, 5, and 6.

In step 706, the capacities and penalties of all vertices in the lattice graph are calculated as explained above.

In step 708, a long distance pin pair in a net of the floor plan is selected. A pin pair is defined to be a long distance pin pair if the following conditions apply:

(i) the pins in the selected pin pair belong to the same net;

(ii) one pin in the selected pin pair is an output pin;

(iii) the other pin in the selected pin pair is an input pin; and (iv) the distance between the pins in the selected pin pair is more than MaxDistance defined in relation (5).

In step 710, an attempt is made to construct a least-penalty path connecting the selected pin pair. A least-penalty path connecting the selected pin pair may be constructed, for example, by the method illustrated in the flow chart of FIG. 6.

In step 712, if a least-penalty path connecting the selected pin pair cannot be constructed, then control transfers to step 714. Otherwise, control transfers to step 716.

In step 714, the selected pin pair is marked as unconnected.

In step 716, if a long distance pin pair in the floor plan remains to be selected, control transfers to step 718. Otherwise, control transfers to step 720.

In step 718, the next long distance pin pair is selected, and control transfers to step 710.

In step 720, if any selected pin pair was marked unconnected, then control transfers to step 722. Otherwise, control transfers to step 724.

In step 722, a notification is returned that one or more pins are unreachable, for example, by the message "there is an unreachable pin". Control then transfers to step 746.

In step 724, a long distance pin pair in a net of the floor plan is selected.

In step 726, an attempt is made to construct the least-penalty path connecting the pins of the selected pin pair, for example, by the method explained above with reference to the flow chart 600.

In step 728, if the least-penalty path $P=(v_1, \ldots, v_n)$ connecting the selected pin pair is successfully constructed, then control transfers to step 730. Otherwise, control transfers to step 734.

In step 730, for each vertex $v_i$ (i=1, . . . n), the capacity of the vertex $v_i$ of the lattice graph, or Capacity($v_i$), is decreased by 1.

In step 732, the penalty Pen($v_i$) equal to pen(Capacity($v_i$)) is recalculated for each vertex $v_i$. Control then transfers to step 736.

In step 734, if the least-penalty path connecting the selected pin pair cannot be constructed, then the selected pin pair is marked as unconnected.

In step 736, if a long distance pin pair in the floor plan remains to be selected, then control transfers to step 738. Otherwise, control transfers to step 740.

In step 738, the next long distance pin pair is selected, and control transfers to step 726.

In step 740, if the selected pin pair was marked as unconnected in step 734, then control transfers to step 742. Otherwise, control transfers to step 744.

In step 742, a notification is returned that there is a bottleneck in the floor plan, and control transfers to step 746.

In step 744, a notification is returned that the floor plan contains no unreachable pin or bottleneck, for example, the message "floor plan OK", and control transfers to step 746.

Step 746 is the exit point of the flow chart 700.

The method of testing a floor plan described above advantageously detects ramptime violations and whether they may be corrected quickly before committing time and resources to the resynthesis stage of the integrated circuit design.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

In another aspect of the present invention, the methods illustrated in the flowchart descriptions above may be embodied in a computer program product. The computer program product includes a medium for embodying a computer program for input to a computer; and a computer program embodied in the medium according to well known programming techniques for causing the computer to perform the following functions: attempting to construct a least-penalty path connecting pins of a long distance pin pair in the floor plan to determine whether there is an unreachable pin in the floor plan; and if there is no unreachable pin, then attempting to construct a least-penalty path connecting pins of the long distance pin pair to determine whether there is a bottleneck in the floor plan.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of testing a floor plan for an integrated circuit prior to resynthesis comprising:
    attempting to construct a least-penalty path connecting pins of each long distance pin pair in the floor plan to determine whether the floor plan has an unreachable pin; and
    if the least-penalty path is constructed, then attempting to construct a least-penalty path connecting pins of each long distance pin pair in the floor plan to determine whether the floor plan has a bottleneck.

2. A method of testing a floor plan for an integrated circuit prior to resynthesis comprising:
    attempting to construct a least-penalty path connecting pins of each long distance pin pair in the floor plan to determine whether the floor plan has an unreachable pin; and
    if the least-penalty path is constructed, then attempting to construct a least-penalty path connecting pins of each long distance pin pair in the floor plan to determine whether the floor plan has a bottleneck wherein:
        one pin of each long distance pin pair is an input pin,
        another pin of each long distance pin pair is an output pin,
        the input pin and the output pin of each long distance pin pair belong to the same net, and
        a distance between the input pin and the output pin of each long distance pin pair exceeds a maximum distance allowed between buffers of a selected type.

3. The method of claim 2 wherein determining whether there is an unreachable pin in the floor plan comprises calculating a penalty function for each vertex of a lattice graph defining the least-penalty path for each long distance pin pair.

4. The method of claim 3 wherein determining whether there is a bottleneck in the floor plan comprises decreasing a capacity function for each vertex of the lattice graph defining the least-penalty path for the selected pin pair and recalculating the penalty function from the decreased capacity function.

5. The method of claim 3 wherein attempting to construct a least-penalty path comprises the following steps:

(a) initializing auxiliary arrays Char[k] and Prev[k] to 0 wherein k is a number of vertices in a lattice graph of the floor plan;

(b) initializing lists $L_t$ and $P_t$ to null wherein $L_t$ and $P_t$ are each a list of vertices of the lattice graph such that distance Dist($L_t$[i], Src) is less than or equal to a natural number t and wherein ($P_t$[i], $L_t$[i]) is a last edge in a path Q connecting a set Src and a vertex $L_t$[i] wherein i is a vertex number in the lattice graph;

(c) initializing a set Src equal to an $R_1$-ball of a vertex v' in the lattice graph containing path $p_1$ and a set Dst equal to an $R_2$-ball of a vertex v" in the lattice graph containing path $p_2$, wherein the $R_1$-ball is a maximum allowable distance from the input pin normalized to the lattice graph and the $R_2$-ball is a maximum allowable distance from the output pin normalized to the lattice graph;

(d) initializing Char[N(v)] to 1 for each vertex v in Src wherein N(v) is a vertex number of the vertex v, initializing a radius of a current neighborhood d to 0, initializing a maximum radius $d_{max}$ to 0, and initializing set $M_0$(Src) to Src;

(e) if Char[N(v)] equals 0 for all vertices v in Dst, then transferring control to step (j), else transferring control to step (f);

(f) setting a path P equal to (v) and a vertex v' equal to Prev[N(v)];

(g) inserting the vertex v' in the path P;

(h) setting the vertex v equal to the vertex v' and the vertex v' equal to Prev[N(v)];

(i) if the vertex v'=0, then transferring control to step (x), else transferring control to step (g);

(j) for each neighboring vertex v' of each vertex v in a set $M_d$(Src)\\$M_{d-1}$(Src), if Char[N(v')] equals 0 and if p is equal to a penalty function Pen(v') and if Pen(v') is less than MaxPenalty, then transferring control to step (k), else transferring control to step (m);

(k) inserting the vertex v in the list $L_{d+p}$ and the vertex v' in the list $P_{d+p}$ wherein d+p is a radius of the current neighborhood plus a current path;

(l) setting $d_{max}$ equal to max$\{d_{max}, d+p\}$;

(m) setting $M_{d-1}$(Src) equal to $M_d$(Src);

(n) initializing i to 1;

(o) setting v equal to $L_{d+1}[i]$;

(p) if Char[N(v)] equals 0, then transferring control to (q), else transferring control to step (s);

(q) inserting v in $M_{d+1}$(Src) and setting Char[N(v)] equal to 1;

(r) setting Prev[N(v)] equal to $P_{d+1}[i]$;

(s) incrementing i by 1;

(t) if i is less than n wherein n is a vertex number of the list $L_{d+1}$, then transferring control to step (o), else transferring control to step (u);

(u) incrementing d by one;

(v) if $d \leq d_{max}$, then transferring control to step (e), else transferring control to step (w);

(w) setting the path P to null; and (x) returning the path P as output.

6. The method of claim 3 wherein determining whether there is an unreachable pin in the floor plan comprises the following steps:

(a) constructing a lattice graph from the floor plan;

(b) calculating capacities and penalties of all vertices in the lattice graph;

(c) selecting a long distance pin pair in a net of the floor plan;

(d) attempting to construct a least-penalty path connecting the selected pin pair from the lattice graph;

(e) if a least-penalty path connecting the selected pin pair cannot be constructed, then transferring control to step (f), else transferring control to step (g);

(f) marking the selected pin pair as unconnected;

(g) if a long distance pin pair remains to be selected, then transferring control to step (h), else transferring control to step (i);

(h) selecting a next long distance pair and transferring control to step (d); and (i) if any selected long distance pin pair was marked as unconnected in step (f), then returning a notification that the floor plan has an unreachable pin.

7. The method of claim 6 wherein determining whether there is a bottleneck in the floor plan comprises the following steps:

(j) if no selected long distance pin pair was marked as unconnected in step (f), then selecting a long distance pin pair in a net of the floor plan;

(k) attempting to construct a least-penalty path connecting the selected long distance pin pair from the lattice graph;

(l) if there is no least-penalty path connecting the selected long distance pin pair, then transferring control to step (o), else transferring control to step (m);

(m) decreasing the capacity of each vertex in the least-penalty path;

(n) recalculating the penalty for each vertex in the least-penalty path and transferring control to step (p);

(o) marking the selected long distance pin pair as unconnected;

(p) if a long distance pin pair remains to be selected, then transferring control to step (q), else transferring control to step (r);

(q) selecting a next long distance pair in a net of the floor plan and transferring control to step (b); and (r) if any selected long distance pin pair was marked as unconnected in step (o), then generating as output a notification that the floor plan has a bottleneck.

8. A computer program product for testing a floor plan for an integrated circuit prior to resynthesis comprising:

a medium for embodying a computer program for input to a computer; and a computer program embodied in the medium for causing the computer to perform the following functions:

attempting to construct a least-penalty path connecting pins of each long distance pin pair in the floor plan to determine whether the floor plan has an unreachable pin; and if the least-penalty path is constructed, then attempting to construct a least-penalty path connecting pins of each long distance pin pair in the floor plan to determine whether the floor plan has a bottleneck.

9. A computer program product for testing a floor plan for an integrated circuit prior to resynthesis comprising:

a medium for embodying a computer program for input to a computer; and a computer program embodied in the medium for causing the computer to perform the following functions:

attempting to construct a least-penalty path connecting pins of each long distance pin pair in the floor plan to determine whether the floor plan has an unreachable pin; and if the least-penalty path is constructed, then attempting to construct a least-penalty path connecting pins of each long distance pin pair in the floor plan to determine whether the floor plan has a bottleteck wherein:

one pin of each long distance pin pair is an input pin, another pin of each long distance pin pair is an output pin, the input pin and the output pin of each long distance pin pair belong to the same net, and a distance between the input pin and the output pin of each long distance pin pair exceeds a maximum distance allowed between buffers of a selected type.

10. The computer program product of claim 9 wherein determining whether there is an unreachable pin in the floor plan comprises calculating a penalty function for each vertex of a lattice graph defining the least-penalty path for each long distance pin pair.

11. The computer program product of claim 10 wherein determining whether there is a bottleneck in the floor plan comprises decreasing a capacity function for each vertex of the lattice graph defining the least-penalty path for the selected long distance pin pair and recalculating the penalty function from the decreased capacity function.

12. The computer program product of claim 9 wherein attempting to construct a least-penalty path comprises the following steps:

(a) initializing auxiliary arrays Char[k] and Prev[k] to 0 wherein k is a number of vertices in a lattice graph of the floor plan;

(b) initializing lists $L_t$ and $P_t$ to null wherein $L_t$ and $P_t$ are each a list of vertices of the lattice graph such that distance Dist($L_t[i]$, Src) is less than or equal to a natural number t and wherein ($P_t[i]$, $L_t[i]$) is a last edge in a path Q connecting a set Src and a vertex $L_t[i]$ wherein i is a vertex number in the lattice graph;

(c) initializing a set Src equal to an $R_1$-ball of a vertex v' in the lattice graph containing path $p_1$ and a set Dst equal to an $R_2$-ball of a vertex v" in the lattice graph containing path $p_2$, wherein the $R_1$-ball is a maximum allowable distance from the input pin normalized to the lattice graph and the $R_2$-ball is a maximum allowable distance from the output pin normalized to the lattice graph;

(d) initializing Char[N(v)] to 1 for each vertex v in Src wherein N(v) is a vertex number of the vertex v, initializing a radius of a current neighborhood d to 0, initializing a maximum radius $d_{max}$ to 0, and initializing set $M_0$(Src) to Src;

(e) if Char[N(v)] equals 0 for all vertices v in Dst, then transferring control to step (j), else transferring control to step (f);

(f) setting a path P equal to (v) and a vertex v' equal to Prev[N(v)];

(g) inserting the vertex v' in the path P;

(h) setting the vertex v equal to the vertex v' and the vertex v' equal to Prev[N(v)];

(i) if the vertex v'=0, then transferring control to step (x), else transferring control to step (g);

(j) for each neighboring vertex v' of each vertex v in a set $M_d$(Src)\$M_{d-1}$(Src), if Char[N(v')] equals 0 and if p is equal to a penalty function Pen(v') and if Pen(v') is less than MaxPenalty, then transferring control to step (k), else transferring control to step (m);

(k) inserting the vertex v in the list $L_{d+p}$ and the vertex v' in the list $P_{d+p}$ wherein d+p is a radius of the current neighborhood plus a current path;

(l) setting $d_{max}$ equal to max{$d_{max}$, d+p};

(m) setting $M_{d+1}$(Src) equal to $M_d$(Src);

(n) initializing i to 1;

(o) setting v equal to $L_{d+1}$[i];

(p) if Char[N(v)] equals 0, then transferring control to (q), else transferring control to step (s);

(q) inserting v in $M_{d+1}$(Src) and setting Char[N(v)] equal to 1;

(r) setting Prev[N(v)] equal to $P_{d+1}$[i];

(s) incrementing i by 1;

(t) if i is less than n wherein n is a vertex number of the list $L_{d+1}$, then transferring control to step (o), else transferring control to step (u);

(u) incrementing d by one;

(v) if $d \leq d_{max}$, then transferring control to step (e), else transferring control to step (w);

(w) setting the path P to null; and (x) returning the path P as output.

13. The computer program product of claim 9 wherein determining whether there is an unreachable pin in the floor plan comprises the following steps:

(a) constructing a lattice graph from the floor plan;

(b) calculating capacities and penalties of all vertices in the lattice graph;

(c) selecting a long distance pin pair in a net of the floor plan;

(d) attempting to construct a least-penalty path connecting the selected pin pair from the lattice graph;

(e) if a least-penalty path connecting the selected long distance pin pair cannot be constructed, then transferring control to step (f), else transferring control to step (g);

(f) marking the selected long distance pin pair as unconnected;

(g) if a long distance pin pair remains to be selected, then transferring control to step (h), else transferring control to step (i);

(h) selecting a next long distance pair and transferring control to step (d); and (i) if any selected long distance pin pair was marked as unconnected in step (f), then returning a notification that the floor plan has an unreachable pin.

14. The computer program product of claim 13 wherein determining whether there is a bottleneck in the floor plan comprises the following steps:

(j) if no selected long distance pin pair was marked as unconnected in step (f), then selecting a long distance pin pair in a net of the floor plan;

(k) attempting to construct a least-penalty path connecting the selected long distance pin pair from the lattice graph;

(l) if there is no least-penalty path connecting the selected long distance pin pair, then transferring control to step (o), else transferring control to step (m);

(m) decreasing the capacity of each vertex in the least-penalty path;

(n) recalculating the penalty for each vertex in the least-penalty path and transferring control to step (p);

(o) marking the selected long distance pin pair as unconnected;

(p) if a long distance pin pair remains to be selected, then transferring control to step (q), else transferring control to step (r);

(q) selecting a next long distance pair in a net of the floor plan and transferring control to step (b); and (r) if any selected long distance pin pair was marked as unconnected in step (o), then generating as output a notification that the floor plan has a bottleneck.

* * * * *